(12) United States Patent
Kinge et al.

(10) Patent No.: US 11,646,202 B2
(45) Date of Patent: May 9, 2023

(54) THREE-DIMENSIONAL ASSEMBLED ACTIVE MATERIAL FROM TWO-DIMENSIONAL SEMICONDUCTOR FLAKES FOR OPTOELECTRONIC DEVICES

(71) Applicant: TOYOTA MOTOR EUROPE, Brussels (BE)

(72) Inventors: Sachin Kinge, Brussels (BE); Jannika Lauth, Delft (NL); Laurens D. A. Siebbeles, Rijswijk (NL)

(73) Assignee: TOYOTA MOTOR EUROPE, Brussels (BE)

( * ) Notice: Subject to any disclaimer, the term of this patent is extended or adjusted under 35 U.S.C. 154(b) by 428 days.

(21) Appl. No.: 16/326,508

(22) PCT Filed: Aug. 30, 2016

(86) PCT No.: PCT/EP2016/070386
§ 371 (c)(1),
(2) Date: Feb. 19, 2019

(87) PCT Pub. No.: WO2018/041335
PCT Pub. Date: Mar. 8, 2018

(65) Prior Publication Data
US 2019/0341249 A1 Nov. 7, 2019

(51) Int. Cl.
*H01L 21/02* (2006.01)
*C01B 19/04* (2006.01)
(Continued)

(52) U.S. Cl.
CPC ........ *H01L 21/02568* (2013.01); *C01B 19/04* (2013.01); *C30B 7/14* (2013.01);
(Continued)

(58) Field of Classification Search
CPC ....... C01B 17/20; C01B 19/007; C01B 19/04; C01G 1/12; C01G 39/06; C30B 29/46;
(Continued)

(56) References Cited

U.S. PATENT DOCUMENTS

| 2011/0056564 A1* | 3/2011 | Korgel | B22F 1/054 423/511 |
| 2011/0057168 A1* | 3/2011 | Kobayashi | G01N 27/4146 257/24 |

(Continued)

OTHER PUBLICATIONS

Jan. 5, 2021 Office Action issued in Chinese Patent Application No. 201680088198.0.
(Continued)

*Primary Examiner* — Matthew J Song
(74) *Attorney, Agent, or Firm* — Oliff PLC

(57) ABSTRACT

A process for preparing stacks of metal chalcogenide flakes includes: (a) reacting together a source of the metal atom of the target metal chalcogenide with a source of the chalcogenide atom of the target metal chalcogenide, in the presence of a spacer, so as to produce flakes of the metal chalcogenide; (b) depositing metal chalcogenide flakes obtained using step (a) onto a substrate to form a stack of assembled metal chalcogenide flakes, wherein the spacer contains an alkyl chain linked to a functional group able to bond to the metal chalcogenide surface, said alkyl chain having a length of less than 18 carbon atoms, preferably between 6 and 14 carbon atoms.

7 Claims, 4 Drawing Sheets

(51) Int. Cl.
*C30B 7/14* (2006.01)
*C30B 29/46* (2006.01)

(52) U.S. Cl.
CPC .......... *C30B 29/46* (2013.01); *H01L 21/0242* (2013.01); *H01L 21/02425* (2013.01); *H01L 21/02601* (2013.01); *H01L 21/02628* (2013.01); *C01P 2002/84* (2013.01); *C01P 2004/03* (2013.01); *C01P 2004/04* (2013.01); *C01P 2004/24* (2013.01); *C01P 2006/40* (2013.01)

(58) Field of Classification Search
CPC .................. C30B 7/14; H01L 21/02568; H01L 21/02601; H01L 21/02628
See application file for complete search history.

(56) References Cited

U.S. PATENT DOCUMENTS

| | | | |
|---|---|---|---|
| 2012/0205598 A1* | 8/2012 | Li | C09K 11/565 252/519.34 |
| 2013/0101829 A1* | 4/2013 | Sasaki | C23C 24/082 428/323 |
| 2014/0252316 A1* | 9/2014 | Yan | C01G 9/08 257/14 |
| 2017/0069813 A1* | 3/2017 | Urban | C01B 19/007 |
| 2017/0369779 A1* | 12/2017 | Owen | C01B 19/04 |
| 2018/0009676 A1* | 1/2018 | Pickett | C09D 11/52 |
| 2019/0211260 A1* | 7/2019 | Won | C08L 57/10 |

OTHER PUBLICATIONS

Mar. 29, 2017 International Search Report issued in International Patent Application No. PCT/EP2016/070386.
Mar. 29, 2017 Written Opinion issued in International Patent Application No. PCT/EP2016/070386.
Jannika Lauth et al. "Solution-Processed Two-Dimensional Ultrathin InSe Nanosheets". Chemistry of Materials, vol. 28, No. 6, Mar. 22, 2016, pp. 1728-1736.
David H. Webber et al. "Photochemical Synthesis of Bismuth Selenide Nanocrystals in an Aqueous Micellar Solution". Inorganic Chemistry, vol. 50, No. 3, Feb. 7, 2011, pp. 723-725.
David H. Webber et al. "Supplementary Information for Photochemical Synthesis of Bismuth Selenide Nanocrystals in an Aqueous Micellar Solution". May 1, 2011, pp. 1-6, URL: <http://pubs.acs.org/doi/suppl/10.1021/ic102206d>.
Priscillla D. Antunez et al. "Solution-Phase Synthesis of Highly Conductive Tungsten Diselenide Nanosheets". Chemistry of Materials, vol. 25, No. 12, Jun. 25, 2013, pp. 2385-2387.
Linrui Hou et al. "Interfacial Self-Assembled Fabrication of Petal-Like CdS/Dodecylamine Hybrids Toward Enhanced Photoluminescence". Langmuir, vol. 25, No. 5, Mar. 3, 2009, pp. 2869-2874.
Paul J. Morrison et al. "Synthesis and Growth Mechanism of Lead Sulfide Quantum Platelets in Lamellar Mesophase Templates". Chemistry of Materials, vol. 26, 2014, pp. 5012-5019.
Jun. 2, 2020 Office Action issued in Japanese Patent Application No. 2019-511718.
Jannika Lauth et al. "Solution-Processed Two-Dimensional Ultrathin InSe Nanosheets". Chemistry of Materials, Feb. 21, 2016, vol. 28, No. 6, pp. 1728-1736.
Aug. 18, 2021 Office Action issued in Chinese Patent Application No. 201680088198.0.
Dec. 9, 2021 Office Action issued in Chinese Patent Application No. 201680088198.0.
Mar. 25, 2022 Office Action issued in Chinese Patent Application No. 201680088198.0.
Antunez et al. "Solution-Phase Synthesis of Highly Conductive Tungsten Diselenide Nanosheets," Chemistry of Materials, vol. 25, pp. 2385-2387, May 30, 2013.
Lauth et al. "Solution-Processed Two-Dimensional Ultrathin InSe Nanosheets," Chemistry of Materials, vol. 28, pp. 1728-1736, Feb. 21, 2016.

* cited by examiner

A= Valence Band; B Conduction Band;
C= Work function or HOMO of spacer

THREE-DIMENSIONAL ASSEMBLED ACTIVE MATERIAL FROM TWO-DIMENSIONAL SEMICONDUCTOR FLAKES FOR OPTOELECTRONIC DEVICES

FIELD OF THE INVENTION

The present invention relates to stacks of flakes of chalcogenide semiconductors. These stacks can be used, for example, in opto-electronic devices which may, for example, be of the following types: ultrathin, flexible, photovoltaics, thermoelectric, optical sensors, LEDs. Spintronic devices are also contemplated here, in applications such as: memory and quantum computing using 2-D topological insulator materials.

BACKGROUND ART

Opto/thermo/electronic devices based on nanomaterials require efficient separation and collection of charges. Two dimensional semiconductor materials with layer-like structures with defined band gaps bear high potential for ultrathin electronics (photovoltaics, LEDs and FETs) due to their dimensionality-dependent anisotropic properties. Usually exfoliation or costly ultra-high vacuum-based physical/chemical deposition techniques are applied for the creation of 2-D layers. However, these methods are not suitable for large scale production of devices. Recently, wet chemical approaches have been developed for the synthesis of 2-D materials. During synthesis these layers are stabilized by spacers which can be organic or inorganic materials.

Lauth et al., *Chem. Mater.*, 28, 1728 (2016), describe colloidal synthesis of ultrathin single crystal InSe nanosheets by lamellar mesophase template growth. A thickness of inorganic InSe nanosheets of only 1.6 nm was reported, not obtainable by exfoliation techniques. Reproducible on-off switching of the device when illuminated was observed. No demonstration was made here of charge separation or measurements of the mobility and behavior of free charges or excitons.

Morrison et al., *Chem Mater*, 26, 5012 (2014) disclose a lamellar mesophase template for growth of ultrathin single crystal PbS nanosheets. No charge separation mobility measurements were made here.

A major issue for use of 2-D semiconductor flakes for optoelectronic applications is charge separation from the individual layers. Creating free moving charges is necessary for the creation of optoelectronic devices.

SUMMARY OF THE INVENTION

To address the above-mentioned issues, the inventors prepared a 3-D assembly of 2-D flakes prepared by chemical synthesis. 2-D sheets are prepared by chemical synthesis in solution, and 3-D films of 2-D nanosheets were created by assembling 2-D flakes using drop casting or similar deposition techniques on surfaces.

The inventors have observed that stacks cannot be reproducibly prepared with nanosheets prepared using spacers having carbon chains as long as 18 carbons. With less than 18 carbon atoms in the spacer chain, reproducible synthesis of stacks, and stability thereof, could be observed.

In one aspect, the present invention thus relates to a process for preparing stacks of metal chalcogenide flakes comprising the steps of:

(a) reacting together a source of the metal atom of the target metal chalcogenide with a source of the chalcogenide atom of the target metal chalcogenide, in the presence of a spacer, so as to produce flakes of the metal chalcogenide;

(b) depositing metal chalcogenide flakes obtained using step (a) onto a substrate to form a stack of assembled metal chalcogenide flakes, wherein the spacer contains an alkyl chain linked to a functional group able to bond to the metal chalcogenide surface, said alkyl chain having a length of less than 18 carbon atoms, preferably between 6 and 14 carbon atoms.

According to another aspect, the present invention relates to stacks of metal chalcogenide flakes obtained according to the process of the invention.

BRIEF DESCRIPTION OF THE FIGURES

FIG. 1 (bottom) shows the formation of stacks by assembly. The right-hand side shows the situation after stacking of InSe sheets in three dimensions. h+ and e− are holes and electrons, respectively.

DETAILED DESCRIPTION OF THE INVENTION

Figure 1:
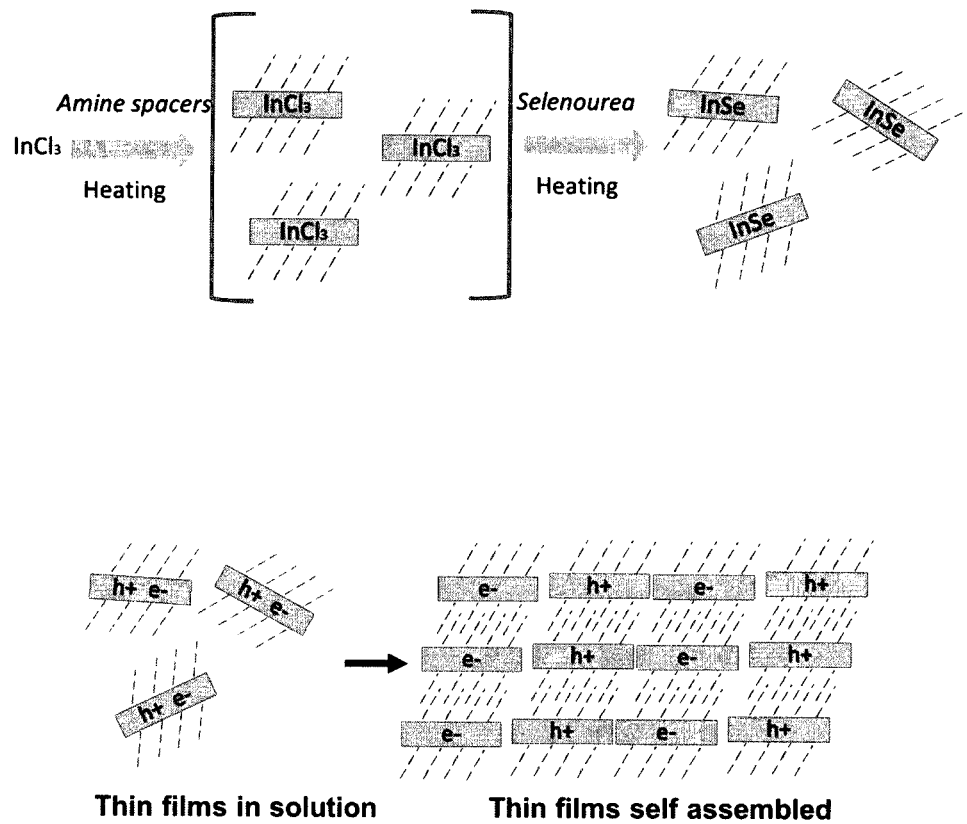
FIG. 1 (top) shows an exemplary scheme for colloidal formation of ultrathin InSe nanosheets via a non-limiting illustrative system for the synthesis of InSe sheets in solution.

In the present invention, the metal chalcogenide used to produce flakes/nanosheets can be any of a number of materials which form layered structures such as the sulfides, selenides or tellurides of Cd, Pb, In, Sb, Zn, Mo, W, In and Ga. Such materials include CdS/Se/Te; PbS/Se/Te; InS/Se/Te; $Sb_2S_3/Se_3$; ZnS/Se/Te; $MoS_2$/Se/Te; $WS_2$/Se/Te; InSe/S; GaS/Se/Te.

In preferred embodiments, the metal chalcogenide is selected from the group consisting of: indium selenide (InSe), molybdenum sulfide ($MoS_2$), lead telluride (PbTe), and lead sulfide (PbSe).

In terms of precursor materials that can be reacted together to produce the target metal chalcogenides, on the metal side, some appropriate precursors include:

For cadmium (Cd): $CdCl_2$, Cd oxide, $Cd(ClO_4)_2$;
For lead (Pb): $PbCl_2$, Pb oxides;
For indium (In): $InCl_3$;
For antimony (Sb): $Sb_2Cl_3$;
For zinc (Zn): $Zn(ClO_4)_2$;
For tungsten (W): tungsten oxide;
For molybdenum (Mo): molybdenum chloride;
For gallium (Ga): elemental gallium.

In terms of precursor materials that can be reacted together to produce the target metal chalcogenides, on the chalcogen side, some appropriate precursors include:

For sulfur (S): 3-mercaptopropionic acid (MPA);
For selenium (Se): elemental selenium, selenourea, tributyl phosphyl selenium, bis(trimethysilyl)selenide;
For tellurium (Te): elemental tellurium.

In generally advantageous processes according to the invention, for example for preparing preferred metal chalcogenide material indium selenide, the source of the metal atom of the target metal chalcogenide may be a metal salt such as a halogenide e.g. chloride, or a carboxylate e.g. acetate.

In generally advantageous processes according to the invention, the source of the chalcogenide atom of the target metal chalcogenide is a urea analogue, such as selenourea. Elemental forms such as elemental selenium may also be appropriate as precursor materials in the present invention.

Concerning spacer molecules, which may also be called "ligands", among generally appropriate molecules there may be cited thiols, amines, phosphine oxides, or carboxylic acids, phosphonic acids ($RPO(OH)_2$), phosphonates ($RPO_3^{2-}$). Combinations of two or more such spacers/ligands are also applicable.

In the present invention, the functional group of the spacer/ligand is thus selected from the group consisting of: primary amine ($-NH_2$), thiol ($-SH$), carboxylic acid ($-CO_2H$), phosphonic acids ($-PO(OH)_2$), or forms thereof in situ obtained in situ by proton exchange, such as deprotonated forms including carboxylate ($-CO_2^-$) and phosphonate ($RPO_3^{2-}$).

Preferred spacers according to the invention are primary amines with an alkyl chain having at most 14 carbon atoms, preferably at most 12 carbon atoms, and at least 6 carbon atoms, preferably at least 8 carbon atoms. Highly preferred spacers are octylamine, decylamine or dodecylamine, notably for the preparation of stacks of the preferred metal chalcogenide material indium selenide.

The interparticle spacing can be controlled by the length or thickness of the spacer. The spacer will advantageously have the property to maintain the quantum confinement in the sheets and facilitate carriers (electron and holes) in different flakes as free carriers after excitation using an external source such as light, voltage or any suitable process. Also, the spacer may further be used for tuning the energy barrier.

In one preferred process embodiment of the present invention, step (a) of the method of the invention comprises the sub-steps of:

(a1.a) providing a first reaction vessel containing the metal precursor material for the target metal chalcogenide, as well as the spacer;
(a2.a) providing a second reaction vessel containing the chalcogen precursor material;
(a1.b) heating of the first reaction vessel;
(a2.b) heating of the second reaction vessel;
(a3) combining the heated contents of the first and second reaction vessels after steps (a1.b) and (a2.b) to produce metal chalcogenide flakes.

The preferred process embodiment mentioned above is applicable, for example, to the preparation of indium selenide from an indium precursor such as indium chloride and a selenium precursor such as selenourea.

In the present invention, the metal chalcogenide flakes may advantageously be deposited onto the substrate in step (b) of the method of the invention by a technique chosen from the group consisting of: drop casting, spin coating, spray coating, and dip coating.

Drop casting is typically performed using a dilute solution of 2-D flakes on quartz/$SiO_2$ substrates. Slow drying is performed for assembly. Spin coating/spray coating is suitable for thicker layers of 3-D flakes. By contrast, dip coating is applied for thickness control using layer-by-layer approach.

Concerning the substrate upon which metal chalcogenide flakes may advantageously be deposited in step (b), the substrate may appropriately be any suitable substrate of a semiconductor/metal nature. Appropriate examples include quartz/$SiO_2$, $TiO_2$, ZnO, Au, Ni, Pt, Ag, all of which are useful for making target devices.

In advantageous process embodiments of the present invention, the following steps are carried out between steps (a) and (b):

(y) purification of the crude metal chalcogenide flakes obtained in step (a); and
(z) redispersal of the purified metal chalcogenide flakes obtained in step (y).

In a preferred case wherein the metal chalcogenide flakes/nanosheets contain indium selenide, the crude indium selenide product may be purified by addition of a solvent, such as 2-propanol and centrifugation. After discarding the colorless supernatant, the nanosheets may be redispersed in a (less polar) solvent such as chloroform or toluene. Such a purification step may appropriately be repeated e.g. two more times. Generally speaking, purification can be carried out notably in such a way as to remove the excess of ligands (spacers) using repeated washing using nonpolar-polar solvent combinations. Solvents such as toluene, hexane, acetone may be useful in such processes.

As mentioned above, according to another aspect, the present invention relates to stacks of metal chalcogenide flakes obtained according to the process of the invention. Despite removal of unbound spacer by purification processes as discussed above, the stacks obtained still contain organic spacers, closely associated with the metal chalcogenide.

Within the practice of the present invention, it may be envisaged to combine any features or embodiments which have hereinabove been separately set out and indicated to be advantageous, preferable, appropriate or otherwise generally applicable in the practice of the invention. The present description should be considered to include all such combinations of features or embodiments described herein unless such combinations are said herein to be mutually exclusive or are clearly understood in context to be mutually exclusive.

Experimental Section—Examples

The following experimental section illustrates experimentally the practice of the present invention, but the scope of the invention is not to be considered to be limited to the specific examples that follow.

InSe Flake Synthesis and Assembly Thereof

In a three necked flask, (A) equipped with a thermocouple and septum, 18.2 mmol (2.856 g) decylamine is combined with 0.076 mmol (17 mg) indium (III) chloride inside a nitrogen-filled glove box. A second three-necked flask (B) is filled with 0.30 mmol (37 mg) of selenourea inside the glove box. Both flasks are transferred to a Schlenk-line and set under nitrogen flow. Flask A is heated carefully for one hour under oil pump vacuum ($10^{-3}$ mbar) to 40° C. and subsequently it is set under nitrogen, heated to 130° C. for 10 minutes (for stable mesophase formation) and afterwards cooled to 100° C. for reaction. During heating of reaction flask A, 4.0 mL of 1-octadecene are added to flask B and the reaction solution is heated to 220° C. under nitrogen to start the formation of reactive selenium species from selenourea. After the selenium precursor reaction mixture is pale yellow, it is cooled to 120° C., transferred by syringe and rapidly injected into flask A. The reaction mixture is heated to 240° C. for one hour to react. The opaque brownish product is cooled to 50° C. after reaction and 5.0 mL of chloroform or toluene are added to the mixture. The crude product is purified by adding 5.0 mL of 2-propanol to the solution and centrifugation at 2000 g for 5 min. After discarding the colorless supernatant, the indium selenide nanosheets are redispersed in 3.0 mL of chloroform or toluene. This purification step is repeated one more time.

Coupled indium selenide films are deposited from solution by drop-casting on the undiluted vortexed solution onto quartz substrates for experiments or by diluting the indium selenide sheet sample by a factor of 10 for measurements in solution. However, other deposition techniques such as spin coating, spray coating can be also applied. Films are assembled in 3-D as stacks and can be densely assembled on surfaces. After deposition of the flakes on the substrate the flakes assembled to form assembly of flakes as stacks with average numbers of 10. The number of flakes in the stacks can be altered by increasing the deposition cycles.

Figure 2:
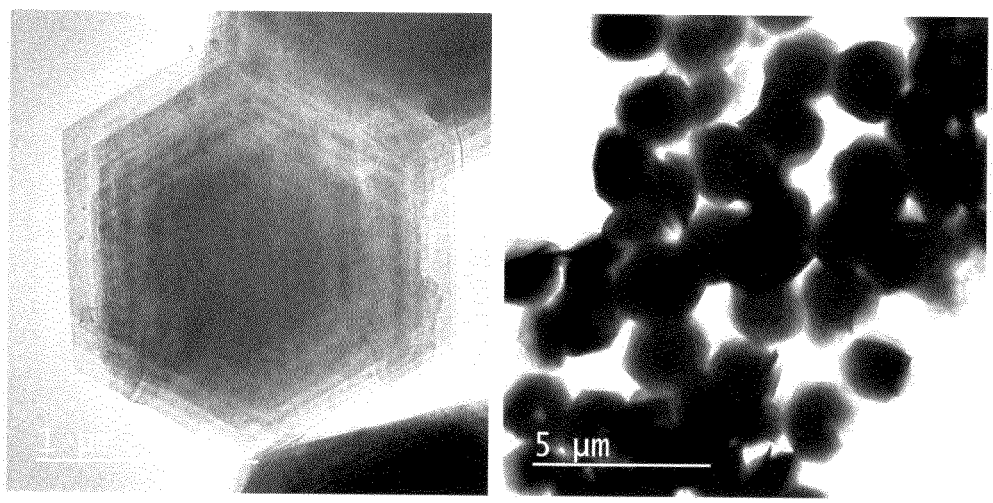
FIG. 2, shows transmission electron microscopy (TEM) images of (left) a stack of several indium selenide nanosheets with decylamine as ligand and having a lateral size of ~1.5 μm, (right) multilayer formation of indium selenide sheets (scale bar ~5 μm).

FIG. 2 (top) shows a scheme for colloidal formation of ultrathin InSe nanosheets: $InCl_3$ is combined with an amine spacer to form the organic ligand template for the reaction with selenourea at 240° C. The organic ligand template is formed by $InCl_3$ and decylamine to yield indium selenide nanosheets of bigger lateral size than available using octadecylamine (ODA). Further, FIG. 1 (bottom) shows formation of stacks by assembly when the flake solution is deposited on substrates by drop casting, spin coating or other suitable techniques.

Figure 3:
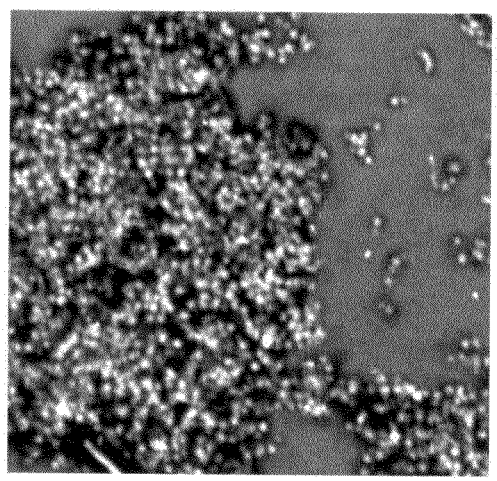
FIG. 3 shows scanning electron microscopy (SEM) analysis of an indium selenide multilayer thin film, formed by drop-casting over ~60 μm.

After the assembly of flakes, TEM analysis, in FIG. 2, shows (left) a stack of several indium selenide nanosheets with decylamine as ligand and lateral size of ~1.5 μm, TEM of right: multilayer formation of indium selenide sheets (scale bar ~5 μm). In FIG. 3, SEM analysis of indium selenide multilayer thin film, formed by drop-casting over ~60 μm, is also shown. It shows stacks deposited on the large area surfaces.

Arranging the flakes in the stacks can lead to formation of free carriers (meaning carriers can be removed from the individual flakes). To understand this process, indium selenide films and solutions were characterized by absorption spectroscopy, transient absorption and ultrafast pump-probe spectroscopy (terahertz spectroscopy) to determine charge mobility. Details of the characterization are given below.

Characterization of Carrier Transport

Figure 4:
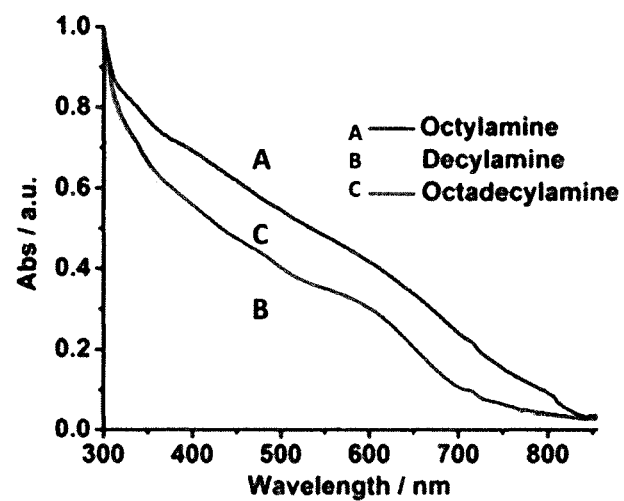
FIG. 4 shows absorption spectrum of InSe nanosheets stabilized with decylamine (or other amines) in solution.

FIG. 4 shows absorption spectrum of InSe nanosheets stabilized with decylamine (or other amines) in solution with a broad absorption feature at around 600 nm. This confirms the formation of 2-D flakes of InSe during synthesis. The absorption is linked to the band gap of material.

Figure 5:
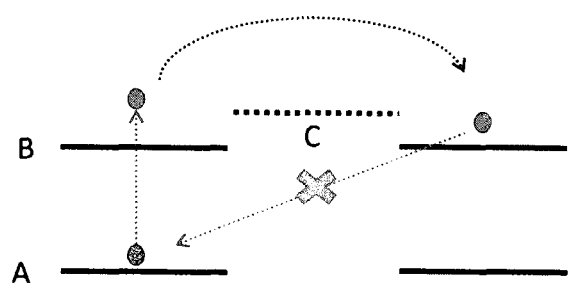
FIG. 5 shows energy diagrams as a band gap and possible explanation of semiconductor flake properties.

Formation of free charge carriers take place when the flakes are stacked together. This is possible as shown in FIG. 5 using energy diagrams. Separation and generation of free carriers takes place as depicted in the band diagram. When two flakes are separated by spacer the band diagram is as shown in the figure.

Figure 6:
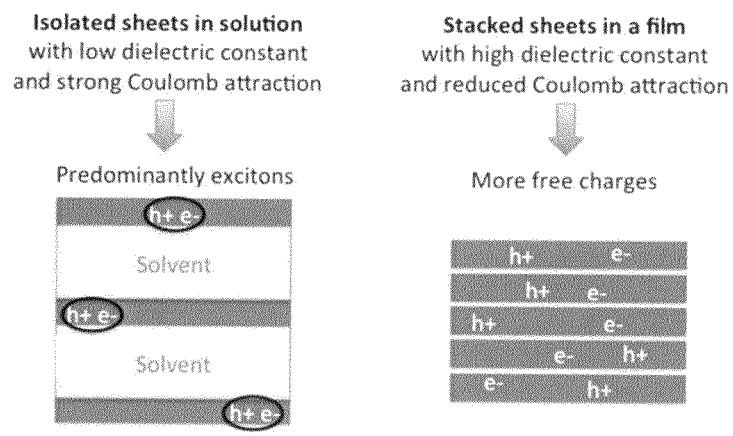
FIG. 6 shows a possible mechanism for higher mobile charge formation in stacked sheets.

Another mechanism possibly operational is shown in FIG. 6 (left). Isolated sheets in solution show a low dielectric constant and strong Coulomb attraction of the charges within the flakes. Predominantly excitons (not separated electron and hole) are formed in this situation. Stacked sheets show higher dielectric constant and smaller Coulomb attraction of the charge carriers. More mobile free charges can be formed in this case.

Figure 7:
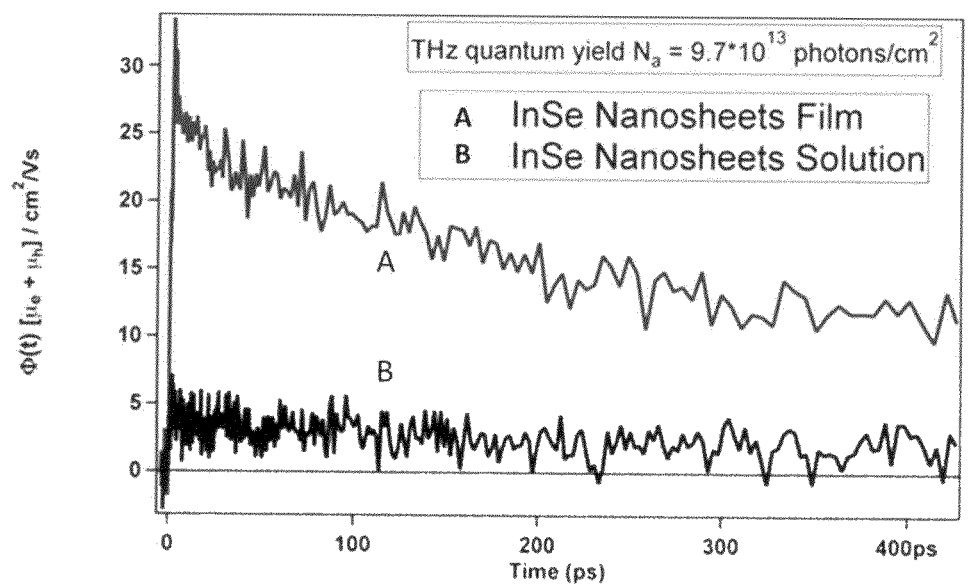
FIG. 7 shows the quantum yield (sum of mobility of holes and electrons) in thin films of indium selenide nanosheets.

Formation of free carriers, separated from individual flakes, is evident from THz measurements. FIG. 7 shows the quantum yield (sum of mobility of holes and electrons) in thin films of indium selenide nanosheets attributed to photo generation of free charges with a mobility of ~30 $cm^2/Vs$ (mobility in solution ~6 $cm^2/Vs$). Thus, stacking of indium selenide thin films leads to free charges with a higher quantum yield of free carriers. This mobility depends on the interparticle separation distance and hence indirectly on the spacer used.

An optimum range of spacer length is needed for maximum charge separation. This range for better charge separation can be tuned depending upon the semiconductor material type, flake size, work function of spacer etc.

Characterization Process Details

Femtosecond transient absorption spectroscopy was used to characterize photo excited charge carrier dynamics in the synthesized 2D materials. Charge carriers are thereby photo-excited by a high energy pumped laser pulse ("pump"). A weaker "probe" pulse is sent through the sample with a time delay with respect to the pump pulse to monitor the difference in the absorption spectrum of the photo-excited sample to the absorption spectrum of the sample in the ground state (A). By changing the time delay between pump and probe and measuring a ΔA difference spectrum each time, one can obtain information about the dynamic processes in the samples, such as the formation and recombination kinetics of free charges and excitons.

A spectra contain information from different processes like:
  the ground state bleach: a fraction of the charge carriers is excited to a higher energy state by the pump pulse, the number of charge carriers in the ground state has been decreased so that the absorption in the excited sample is less than the absorption in the ground state—a negative signal is obtained;
  stimulated emission: a fraction of excited charge carriers can undergo stimulated emission from the excited state to the ground state when interacting with the weak probe pulse: a negative −A signal is obtained because more light hits the detector;
  induced/excited state absorption: some exited charge carriers might get even further excited to higher energy states: a positive −A signal is obtained because the additional light is absorbed.

Samples for the transient absorption and terahertz spectroscopy measurements are prepared as follows (all preparations were carried out under inert gas atmosphere inside the glove box):
  Solution measurements: the concentrated InSe solution obtained in the synthesis given above is diluted by factor 2 with toluene and transferred into a quartz cuvette with light path length 1 mm. The sample is mounted into the transient absorption and the terahertz spectroscopy set-up and measured while stirring with a magnetic stirrer;
  Film measurements: 3 mL of the concentrated solution from 1.5 are drop-casted onto a quartz glass sample holder. After dropping 1 mL of the sample the deposited solution was dried completely before additionally adding more sample. This step was repeated twice more.

The results obtained by transient absorption and terahertz spectroscopy were evaluated with Igor to obtain 2D spectra and decay traces.

The invention claimed is:

1. A process for preparing stacks of metal chalcogenide flakes comprising steps of:
   (a) reacting together a source of a metal atom of a target metal chalcogenide with a source of a chalcogenide atom of the target metal chalcogenide, in the presence of a spacer, so as to produce flakes of the metal chalcogenide, the flakes of the metal chalcogenide having a lateral size of about 1.5 µm; and
   (b) depositing metal chalcogenide flakes obtained using step (a) onto a substrate to form a stack of assembled metal chalcogenide flakes,
      wherein the spacer is decylamine and contains an alkyl chain linked to a functional group to bond to a surface of the metal chalcogenide, and
      the metal chalcogenide is indium selenide (InSe).

2. The process according to claim 1, wherein the source of the metal atom of the target metal chalcogenide is a metal salt.

3. The process according to claim 1, wherein the source of the chalcogenide atom of the target metal chalcogenide is a urea analogue.

4. The process according to claim 1, wherein the metal chalcogenide flakes are deposited onto the substrate in step (b) by a technique chosen from a group consisting of: drop casting, spin coating, spray coating, and dip coating.

5. The process according to claim 1, wherein the substrate is chosen from a group consisting of: quartz/$SiO_2$, $TiO_2$, ZnO, Au, Ni, Pt, and Ag.

6. The process according to claim 1, wherein step (a) includes sub-steps of:
   (a1.a) providing a first reaction vessel containing a metal precursor material for the target metal chalcogenide, as well as the spacer;
   (a2.a) providing a second reaction vessel containing a chalcogen precursor material;
   (a1.b) heating of the first reaction vessel;
   (a2.b) heating of the second reaction vessel; and
   (a3) combining the heated contents of the first and second reaction vessels after steps (a1.b) and (a2.b) to produce the metal chalcogenide flakes.

7. The process according to claim 1, wherein the following steps are carried out between steps (a) and (b):
   (y) purification of the crude metal chalcogenide flakes obtained in step (a); and
   (z) redispersal of the purified metal chalcogenide flakes obtained in step (y).

* * * * *